(12) United States Patent
Matsuzawa et al.

(10) Patent No.: US 8,292,705 B2
(45) Date of Patent: Oct. 23, 2012

(54) ELECTRONIC APPARATUS, FAN UNIT, AND SUBRACK

(75) Inventors: Tadashi Matsuzawa, Tokyo (JP); Syuichi Kusaki, Tokyo (JP)

(73) Assignee: NEC Corporation, Tokyo (JP)

( * ) Notice: Subject to any disclaimer, the term of this patent is extended or adjusted under 35 U.S.C. 154(b) by 148 days.

(21) Appl. No.: 11/375,247

(22) Filed: Mar. 15, 2006

(65) Prior Publication Data

US 2006/0223433 A1 Oct. 5, 2006

(30) Foreign Application Priority Data

Mar. 16, 2005 (JP) .................................. 2005/74548

(51) Int. Cl.
  *H05K 5/00* (2006.01)
  *H02K 7/20* (2006.01)
(52) U.S. Cl. .................. 454/184; 361/695; 361/687
(58) Field of Classification Search .................. 454/184
  See application file for complete search history.

(56) References Cited

U.S. PATENT DOCUMENTS

| 5,398,159 A | 3/1995 | Andersson et al. | |
| 6,804,115 B2* | 10/2004 | Lai ................................. | 361/695 |
| 2003/0124970 A1* | 7/2003 | Webster et al. ............... | 454/184 |
| 2004/0129005 A1 | 7/2004 | Johnson et al. | |
| 2004/0240177 A1 | 12/2004 | Suzuki et al. | |
| 2005/0159098 A1* | 7/2005 | Johnson et al. ............... | 454/184 |
| 2007/0129000 A1* | 6/2007 | Rasmussen et al. .......... | 454/184 |

FOREIGN PATENT DOCUMENTS

| DE | 10128367 A1 * | 1/2003 |
| JP | H07-074492 A | 3/1995 |
| JP | H07-506222 T | 7/1995 |
| JP | 2000-59061 A | 2/2000 |
| JP | 2000-099209 A | 4/2000 |
| JP | 2002-118387 A | 4/2002 |
| JP | 2003-23281 A | 1/2003 |
| JP | 2003-078268 A | 3/2003 |
| JP | 2004-200344 A | 7/2004 |

OTHER PUBLICATIONS

Computer translation of Abstract of doc DE 101 28 367 A1.*

* cited by examiner

*Primary Examiner* — Steven B McAllister
*Assistant Examiner* — Helena Kosanovic
(74) *Attorney, Agent, or Firm* — Sughrue Mion, PLLC (57) ABSTRACT

The fan unit according to the present invention includes a plurality of radial fans; and a unit casing which accommodates the radial fans and includes a first member and a second member, each of which has exhaust ports allowing transmission of at least a part of output air from the radial fans.

16 Claims, 13 Drawing Sheets

ELECTRONIC APPARATUS, FAN UNIT, AND SUBRACK

BACKGROUND OF THE INVENTION

1. Field of the Invention

The present invention relates to an electronic apparatus, a fan unit, and a subrack, and more specifically, to an electronic apparatus with a cooling structure particularly suitable for a radio base station apparatus, a fan unit, and a subrack suitable for cooling the electronic apparatus.

2. Description of the Related Art

A cooling structure for cooling an electronic apparatus by using an axial fan is disclosed, for example, in Japanese Patent Laid-Open Publication JP 2000-59061 A and JP 2002-118387 A. JP 2000-59061 A discloses an electronic apparatus equipped with a casing, and a plurality of electronic component modules accommodated in the casing. Here, a fan in the electronic apparatus sucks the air within the casing to generate an airflow inside the casing, and the sucked air is discharged through an exhaust port. JP 2002-118387 A discloses a computer cooling structure. Here, in a computer equipped with a cooling axial fan for dissipating heat generated in an electronic component module into the atmosphere, exhaust ports are formed in two side surfaces of the casing. Such a cooling structure using an axial fan is also applied to conventional radio base station apparatuses.

A conventional radio base station apparatus contains, inside an apparatus frame having an open-rack structure, a subrack for accommodating a large number of electronic component modules. Nowadays, regarding radio base station apparatuses, since packaging density, in particular, is becoming increasingly higher, it is important to efficiently dissipate the heat generated from the large number of electronic components. An example of a conventional radio base station apparatus cooling structure will be described with reference to FIGS. 1A through 2B.

Figure 1A:
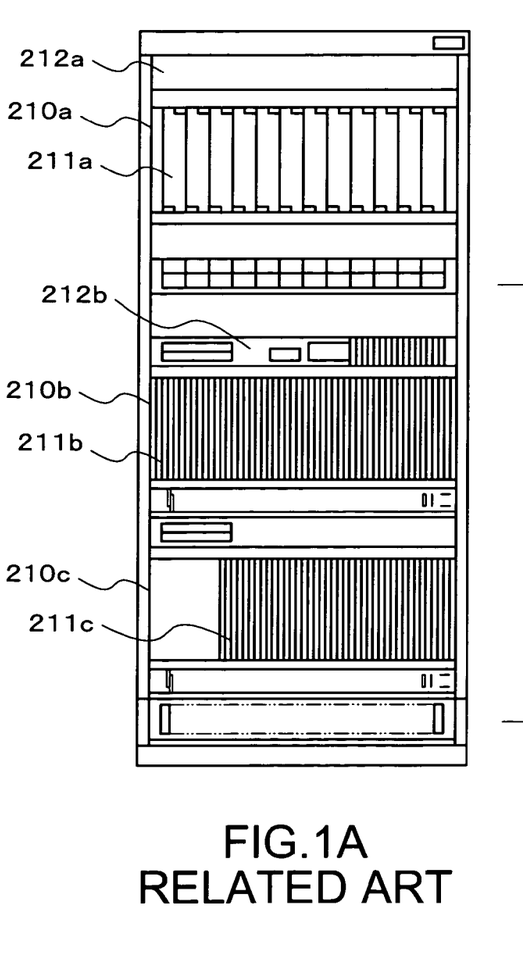
FIG. 1A is a front view of a conventional electronic apparatus.
Figure 1B:
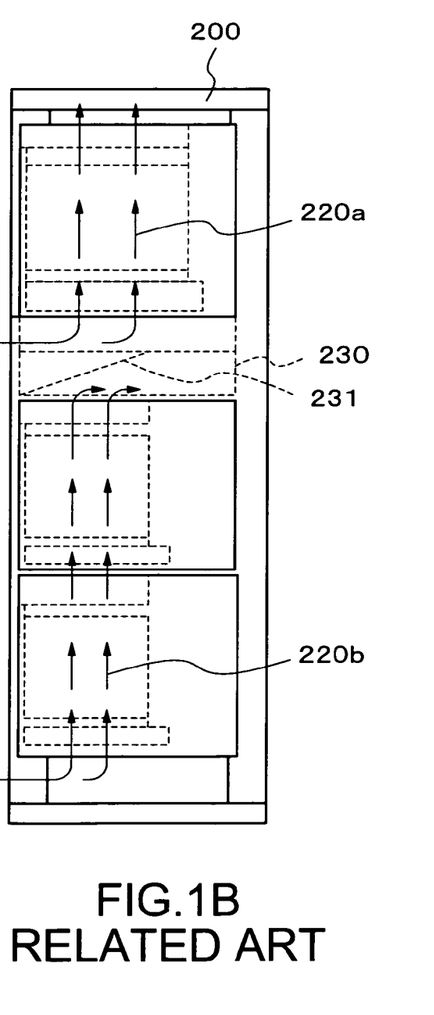
FIG. 1B is a side view of the conventional electronic apparatus.
Figure 1C:
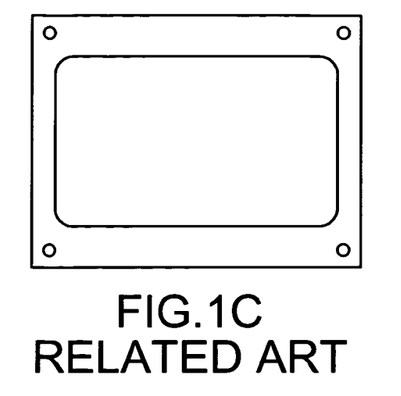
FIG. 1C is a plan view of the conventional electronic apparatus.

FIGS. 1A, 1B, and 1C are a front view, a side view, and a plan view, respectively, schematically showing the construction of a conventional radio base station apparatus. FIG. 1B shows a cooling air 220a and a cooling air 220b generated by a cooling fan described below.

The radio base station apparatus is equipped with an apparatus frame 200, electronic component module groups 211a through 211c, subracks 210a through 210c, and fan units 212a and 212b. Within the apparatus frame 200, a plurality of subracks 210a through 210c are stacked in the height direction. The subracks 210a through 210c accommodate the electronic component module groups 211a through 211c each composed of a large number of electronic component modules. Within the apparatus frame 200, there are further arranged the cooling fan units 212a and 212b for cooling the electronic component module groups 211a through 211c. In the example shown in FIG. 1A, one fan unit 212a is provided above the uppermost subrack 210a. Further, the fan unit 212b is provided above the middle subrack 210b.

In FIG. 1A, the fan unit 212b is used for the purpose of cooling the middle and lowermost subracks 210b and 210c. Although not shown, the fan units 212a and 212b of FIGS. 1A and 1B have axial fans. When axial fans are used, cooling air thereby generated flows in the direction of the rotation axes of the fans, and is discharged upwardly as shown in FIG. 1B. The direction of the cooling air has a great influence on the arrangement of the subracks and, at the same time, imparts dimensional limitations to the fan units.

That is, as shown in FIG. 1B, it is necessary to provide, in addition to the fan unit 212b, a duct 230 with a partition 231 between the middle subrack 210b and the uppermost subrack 210a. The duct 230 forms a flow passage for causing the cooling air 220b to head for the rear side. Further, the partition 231 forms a flow passage for preventing interference with each other of the exhaust air of the middle-stage fan unit 212b and the intake air of the upper-stage fan unit 212a, which are generated as a result of the adoption of the axial fans. The cooling air 220a from the upper-stage fan unit 212a is discharged through a top portion of the apparatus frame 200 having an open-rack structure. The cooling air 220b intercepted by the partition 231 in the duct 230 is discharged toward the rear side of the apparatus frame 200. In this conventional radio base station apparatus, the duct 230 between the subracks 210a and 210b constitutes a factor leading to rather low accommodation efficiency for the subracks in the apparatus frame 200.

Figure 2A:
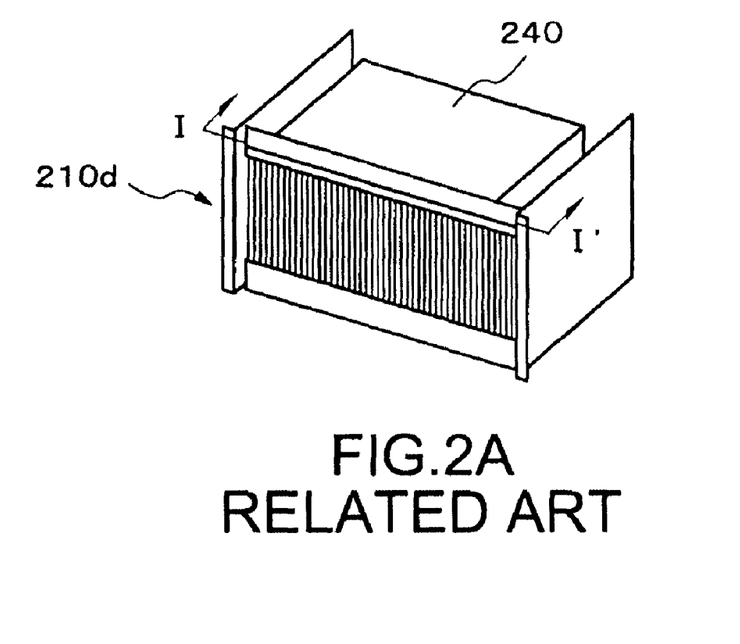
FIG. 2A is a front perspective view schematically showing a construction of a conventional subrack accommodating a fan unit in which a plurality of radial fans are arranged.
Figure 2B:
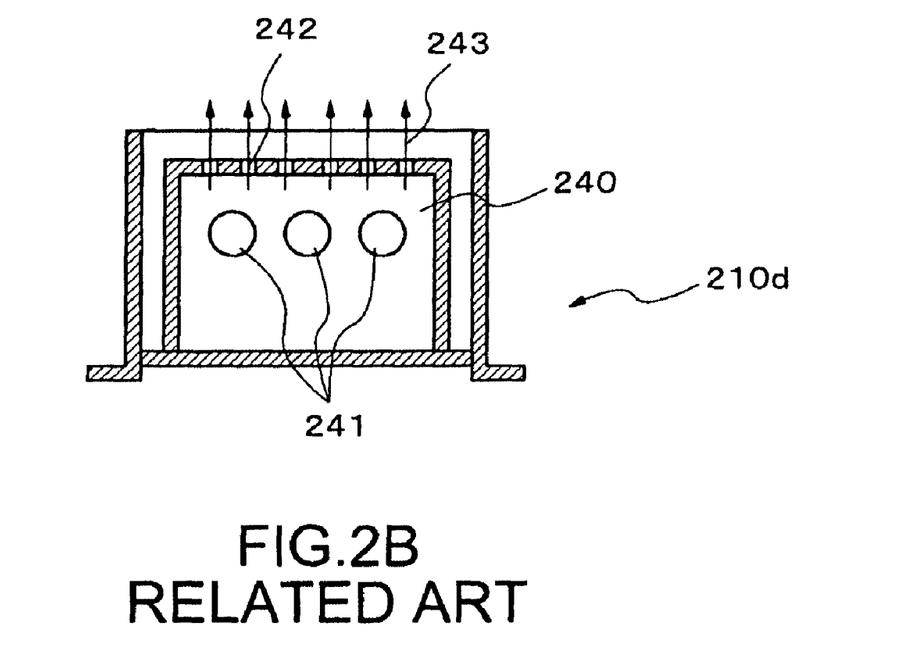
FIG. 2B is a sectional view taken along the line I-I' of FIG. 2A.

Apart from this, there exists a known example which adopts, in the fan unit for cooling the subrack, a radial fan (a fan exhausting air in the radial direction) requiring no such duct 230 as described above. When adopting a radial fan, one fan unit usually accommodates one radial fan in order to avoid interference of exhaust airflows. However, in the case of a thin-type radial fan, there is involved a shortage of cooling capacity with a single radial fan. Thus, in a subrack for an electronic apparatus of large heat generation amount, the arrangement of a fan unit with a plurality of radial fans is indispensable. In arranging a plurality of radial fans, interference of exhaust airflows from the radial fans must be taken into consideration. FIG. 2A is a front perspective view schematically showing a construction of a subrack 210d accommodating a fan unit 240 in which a plurality of radial fans are arranged. FIG. 2B is a sectional view taken along the line I-I' of FIG. 2A. As shown in FIG. 2B, generally speaking, a plurality of radial fans 241 are arranged two-dimensionally in a row inside the fan unit 240. Although not shown, an opening is provided in the bottom surface of the fan unit 240. A plurality of electronic component modules is arranged under the fan unit 240. Further, exhaust ports 242 are provided on the rear side of the fan unit 240. A cooling air 243 is discharged through the exhaust ports 242. JP 2000-59061 A, mentioned above, includes a statement to the effect that the adoption of radial fans is also possible.

Here, to secure the requisite cooling capacity, it is necessary to provide additional radial fans. However, JP 2000-59061 A and the example shown in FIGS. 2A and 2B only teach the installment of a single row of radial fans; with a single row of radial fans, there is a fear of the requisite cooling capacity not being secured. Further, even if, in the fan unit of FIGS. 2A and 2B, additional radial fans are provided on the front side of the subrack, the cooling air from the additional radial fans provided on the front side is not discharged since the exhaust ports are only provided on the rear side of the subrack. As a result, a deterioration in cooling capacity is involved.

As stated above, the accommodation efficiency of a subrack accommodated in a radio base station apparatus greatly depends on the cooling structure thereof. However, it has been rather difficult to obtain a radio base station apparatus capable of enhancing the accommodation efficiency of the subrack and securing the requisite cooling capacity.

SUMMARY OF THE INVENTION

It is an exemplary feature of the present invention to provide an electronic apparatus with an improved cooling structure capable of securing the requisite cooling capacity for cooling the electronic apparatus and electronic component modules and capable of enhancing the accommodation efficiency of a subrack, and a fan unit and a subrack that can be suitably used in the electronic apparatus.

The fan unit according to the present invention includes a plurality of radial fans; and a unit casing which accommodates the radial fans and includes a first member and a second member, each of which has exhaust ports allowing transmission of at least a part of output air from the radial fans.

The subrack according to the present invention includes a shelf which accommodates electronic components; and a fan unit arranged above the electronic components and including a plurality of radial fans and a unit casing which accommodates the radial fans and includes a first member and a second member, each of which has exhaust ports allowing transmission of at least a part of output air from the radial fans.

The electronic apparatus according to the present invention includes a subrack having a shelf which accommodates electronic components, and a fan unit arranged above the electronic components, the fan unit including a plurality of radial fans and a unit casing which accommodates the radial fans and includes a first member and a second member, each of which has exhaust ports allowing transmission of at least a part of output air from the radial fans; and an apparatus frame which accommodates the subrack.

According to the present invention, it is possible to obtain an electronic apparatus with a cooling structure capable of securing the requisite cooling capacity for cooling the electronic apparatus and electronic component modules and capable of enhancing the accommodation efficiency of a subrack, and a fan unit and a subrack that can be suitably used in the electronic apparatus.

BRIEF DESCRIPTION OF THE DRAWINGS

The above and other exemplary features, and advantages of the present invention will become more apparent from the following detailed description when taken in conjunction with the accompanying drawings wherein.

DETAILED DESCRIPTION OF THE EXEMPLARY EMBODIMENTS

Figure 3A:
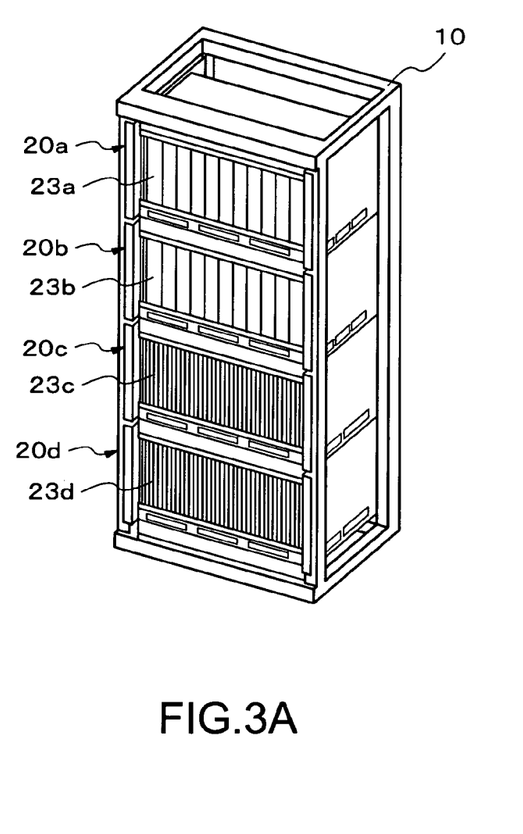
FIG. 3A is a front perspective view of an electronic apparatus according to a first exemplary embodiment of the present invention.
Figure 3B:
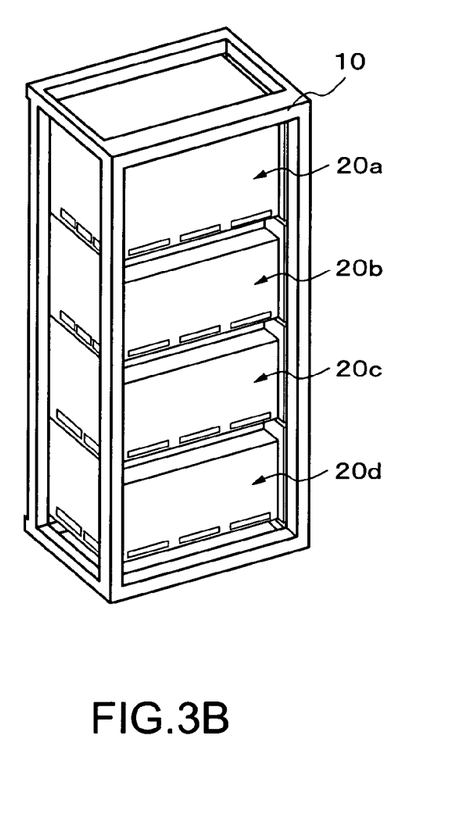
FIG. 3B is a rear perspective view of the electronic apparatus according to the first exemplary embodiment of the present invention.

Next, exemplary embodiments of the present invention will be described with reference to the drawings. FIGS. 3A and 3B are a front perspective view and a rear perspective view, respectively, of an electronic apparatus, i.e., a radio base station apparatus to be installed indoors, according to a first exemplary embodiment of the present invention. As shown in the figures, the radio base station apparatus has an open-rack structure, and includes an apparatus frame 10, and subracks 20a through 20d stacked, inside the apparatus frame 10, in four stages in a height direction.

The subracks 20a through 20d respectively accommodate electronic component module groups (inner modules) 23a through 23d inserted therein to be arranged so as to be perpendicular to a direction of a bottom surface of the apparatus frame 10. Each module of the electronic component module groups 23a through 23d includes an electronic circuit board and a front panel. In FIGS. 3A and 3B, the subrack 20a and the subrack 20c differ from each other in an amount of heat generated by the electronic module groups they respectively accommodate, and their structures differ accordingly. The subrack 20b is of the same structure as the subrack 20a, and the subrack 20d is of the same structure as the subrack 20c (as described in detail below).

Figure 4A:
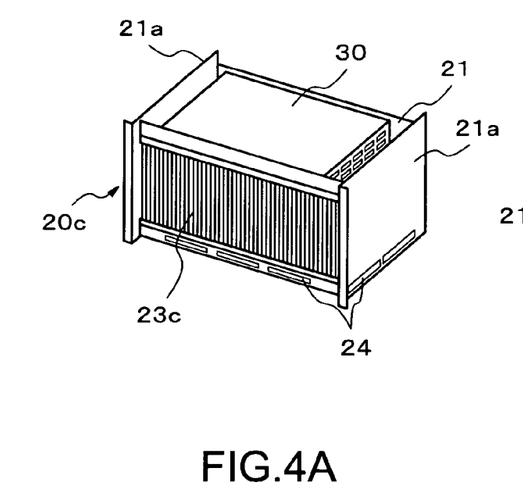
FIG. 4A is a front perspective view of a subrack included in the electronic apparatus shown in FIG. 3A.
Figure 4B:
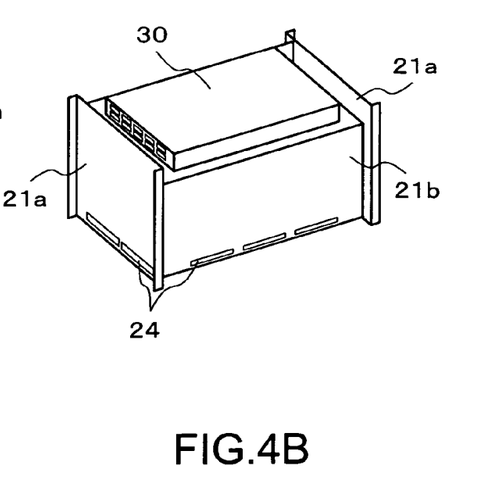
FIG. 4B is a rear perspective view of a subrack included in the electronic apparatus shown in FIG. 3B.

FIGS. 4A and 4B are a front perspective view and a rear perspective view, respectively, of the subrack 20c included in the radio base station apparatus shown in FIGS. 3A and 3B. In FIGS. 3A and 4A, details on the front panels of the electronic component module groups 23a through 23d are omitted. Further, electrical wiring portions of the electronic module groups 23a through 23d are also omitted. The subrack 20c includes a subrack casing 21, intake ports 24, and a cooling fan unit 30. The subrack casing 21 includes side plates 21a and a rear plate 21b.

Not only the subrack 20c but also each of the other subracks 20a, 20b, and 20d has a cooling fan unit 30 mounted to a top portion thereof, for cooling the electronic component module groups 23a, 23b, and 23d, respectively.

Figure 4C:
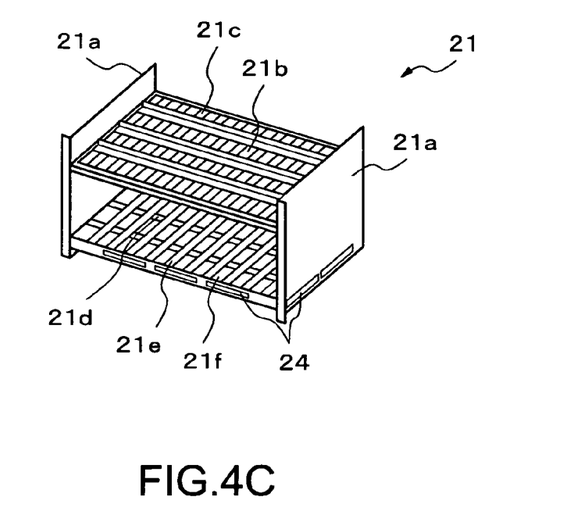
FIG. 4C is a perspective view of the subrack with the fan unit and the electronic component module group removed.

FIG. 4C is a perspective view of the subrack casing (shelf) 21 of the subrack 20c of FIG. 4A with the cooling fan unit 30 and the electronic module group 23c removed. A support member 21c for supporting the cooling fan unit 30 is open in a lattice-like fashion. A bottom member 21d for supporting the electronic component module group 23c has guide rails 21e for mounting the electronic component module group 23c and a plurality of openings 21f for ventilation formed between the guide rails 21e. Further, the subrack casing 21 has a plurality of intake ports 24 (as described in detail below). As stated above, the subrack 20d is of the same construction as the subrack 20c. The subracks 20a and 20b will be described in detail below.

Figure 5A:
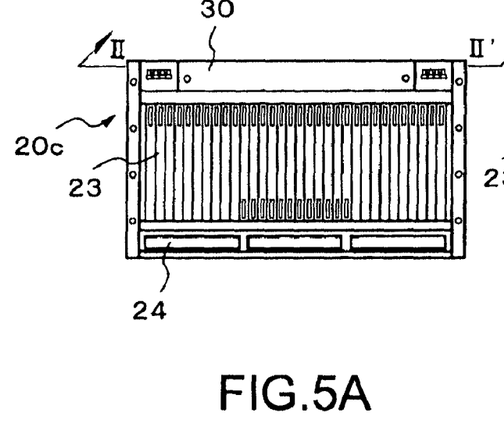
FIG. 5A is a front view schematically showing a construction of the subrack shown in FIG. 4A.
Figure 5B:
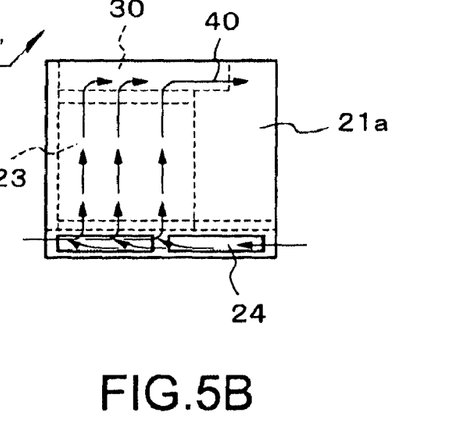
FIG. 5B is a side view schematically showing a construction of the subrack shown in FIG. 4B.
Figure 5C:
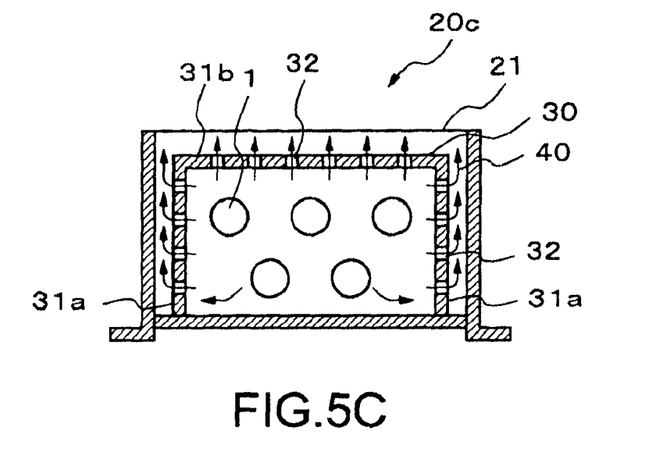
FIG. 5C is a sectional view taken along the line II-II' of FIG. 5A.

FIGS. 5A and 5B are a front view and a side view, respectively, schematically showing a construction of the subrack 20c shown in FIG. 4A. FIG. 5C is a sectional view taken along the line II-II' of FIG. 5A. In FIGS. 5B and 5C, in particular, a direction of cooling air 40 is indicated by arrows.

Figure 5D:
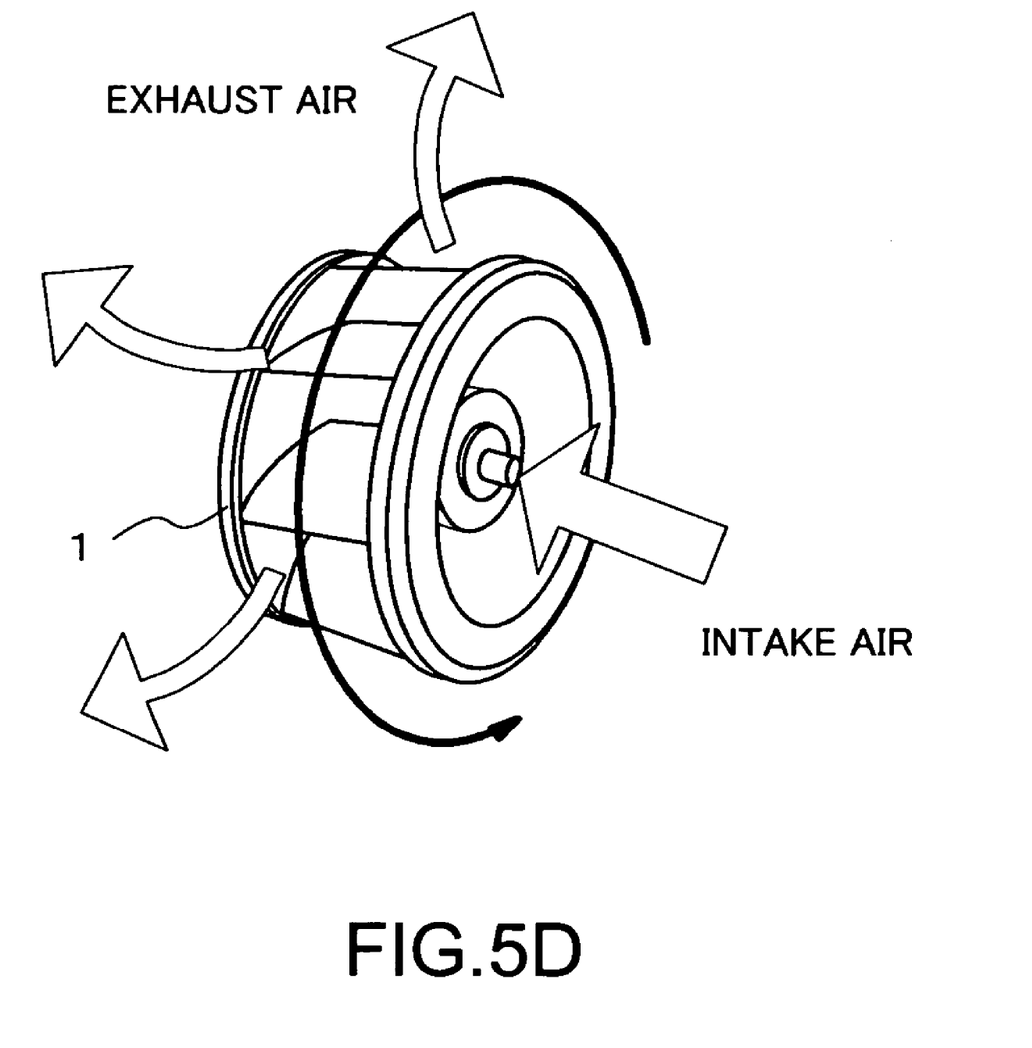
FIG. 5D is a diagram schematically illustrating an operation of a radial fan.

A plurality of cooling fans is arranged inside the cooling fan unit 30. As shown in FIG. 5C, two cooling fans are arranged on a front side of the subrack 20c, and three cooling fans are arranged on a rear side thereof. As the cooling fans, radial fans 1 are adopted. FIG. 5D is a perspective view schematically illustrating an operation of the radial fan 1. As shown in FIG. 5D, the radial fan takes in air in a rotation axis direction, and performs exhaust radially (in a radial direction).

The cooling fan unit 30 has five radial fans 1 arranged in two rows parallel to the rear surface. To avoid interference between exhaust rows, the radial fans 1 are staggered with respect to the radial fans 1 of the adjacent row.

Figure 6A:
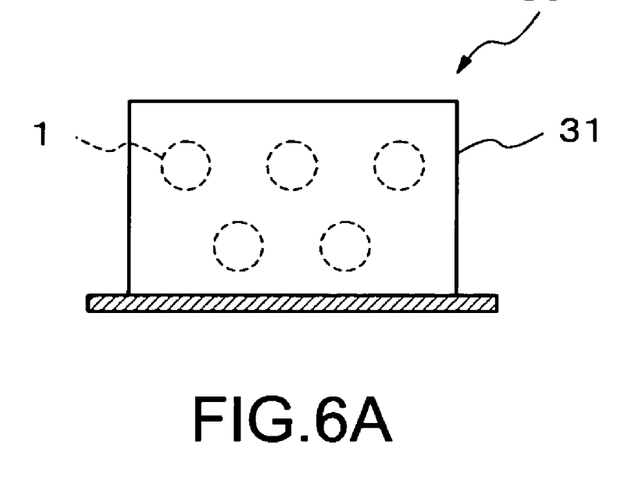
FIG. 6A is a plan view schematically showing a construction of the cooling fan unit shown in FIG. 4A.
Figure 6B:
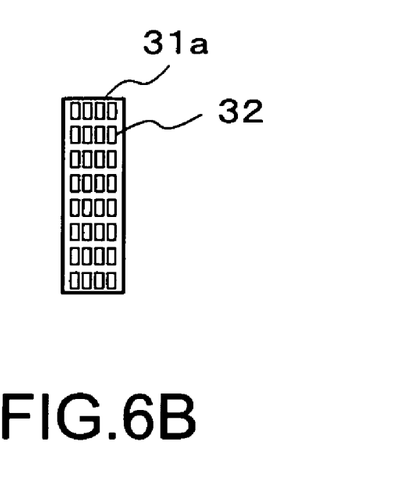
FIG. 6B is a side view schematically showing the construction of the cooling fan unit shown in FIG. 4A.
Figure 6C:
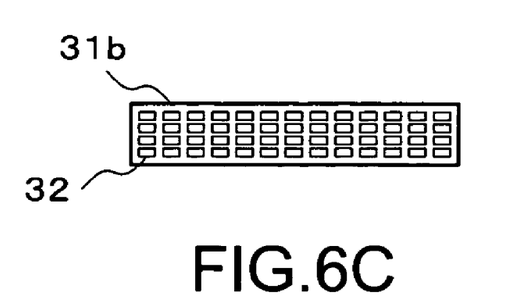
FIG. 6C is a rear view schematically showing the construction of the cooling fan unit shown in FIG. 4A.

FIGS. 6A, 6B, and 6C are a plan view, a side view, and a rear view schematically showing a construction of the cooling fan unit 30 of the subrack 20c shown in FIGS. 5A, 5B, and 5C. As shown in the figures, the cooling fan unit casing (unit casing) 31 includes a pair of side members (second members) 31a and a rear member (first member) 31b. Lattice-like holes are formed in the side members 31a and the rear member 31b. These holes constitute exhaust ports 32 for effecting exhaust from the cooling fan unit 30. The exhaust ports 32 allow transmission of the output air of the radial fans 1. The reason for forming the exhaust ports 32 as lattice-like holes is to prevent intrusion of foreign matter or the like. The side members 31a and the rear member 31b may be plate-like members with lattice-like holes, or net-like members, or members with a plurality of louvers as described below.

As shown in FIGS. 4A through 4C and FIG. 5A, intake ports 24 for the radial fans 1 are formed in lower portions of the side plates 21a and the rear plate 21b of the subrack casing 21 and at positions of a front surface adjacent to the bottom member 21d. As described above, the cooling fan unit 30 has the exhaust ports 32 formed in the rear member 31b and the pair of side members 31a. Thus, as shown in FIG. 5B, the cooling air 40 is taken in horizontally from the intake ports 24 on a lower side of the subrack 20c by the radial fans 1, and vertically passes through the electronic component modules. By this intake, the electronic component modules are cooled. As shown in FIG. 5C, the cooling air 40 after cooling flows horizontally from the inner side of the blades of the radial fans 1 radially outwards, and is exhausted by way of the exhaust ports 32 formed in the rear member 31b and the side members 31a of the cooling fan unit 30.

Due to the formation of the exhaust ports 32 in the rear member 31b and the side member 31a of the cooling fan unit 30, the cooling air (exhaust heat) from the radial fans 1 arranged in a rear row is mainly exhausted by way of the exhaust ports 32 of the rear member 31b, whereas the cooling air (exhaust heat) from the radial fans 1 arranged in a front row is mainly exhausted through the exhaust ports 32 of the side members 31a. Synergistically with the staggered arrangement of the radial fans, this construction of the cooling fan unit 30 helps to mitigate the interference of exhaust airflows of radial fans 1 between the two rows.

The cooling air 40 exhausted from the exhaust ports 32 of the side members 31a of the cooling fan unit 30 passes through spaces between the side members 31a of the cooling fan unit 30 and the side plates 21a of the subrack casing 21, and flows by way of the rear side of the subrack 20c to be exhausted from the rear side of the apparatus frame 10. Thus, the exhaust air from the exhaust ports 32 of the side members 31a of the cooling fan unit 30 is not discharged from the side surface sides of the apparatus frame 10, but is discharged solely from the rear surface side of the apparatus frame 10. As a result, it is possible to avoid exhaust interference that could otherwise occur between this subrack and the subracks mounted in other adjacent apparatus frames.

Figure 7A:
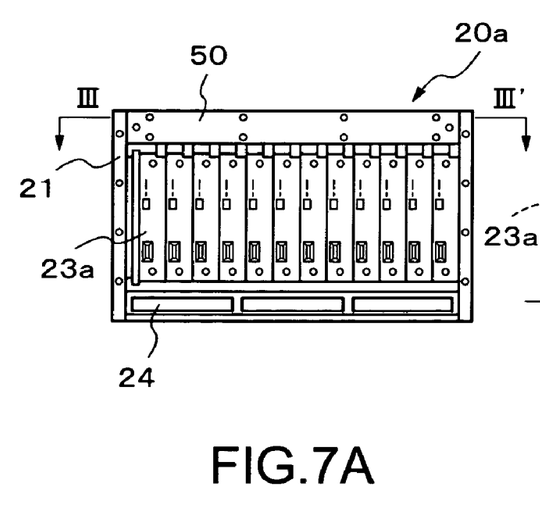
FIG. 7A is a front view schematically showing a construction of the subrack included in the electronic apparatus shown in FIG. 3A.
Figure 7B:
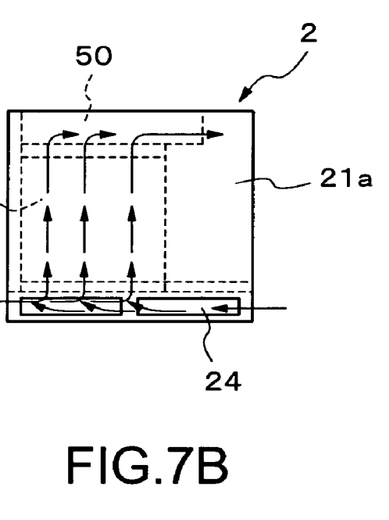
FIG. 7B is a side view schematically showing the construction of the subrack included in the electronic apparatus shown in FIG. 3A.
Figure 7C:
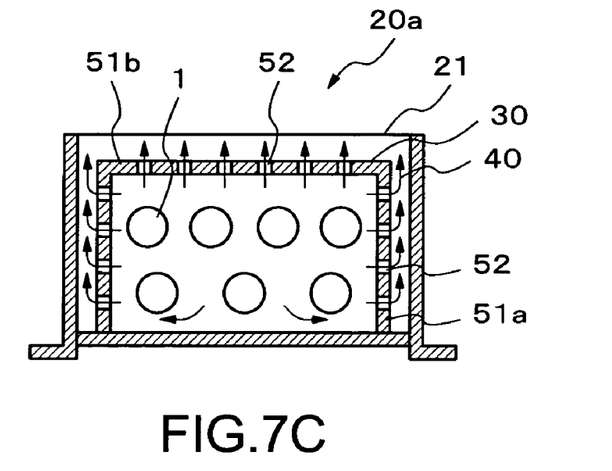
FIG. 7C is a sectional view taken along the line III-III' of FIG. 7A.

According to the amounts of heat generated by the accommodated electronic component modules 23a through 23d, the subracks 20a through 20d included in the electronic apparatus of the first exemplary embodiment differ from each other in the size of the subrack casing 21 and the size of the intake ports 24. FIGS. 7A and 7B are a front view and a side view schematically showing a construction of the subrack 20a shown in FIG. 3A. FIG. 7C is a sectional view taken along the line III-III' of FIG. 7A. The subrack 20a is constructed taking into account the fact that the amount of heat generated by the electronic component modules accommodated therein is larger than the amount of heat generated by the electronic component modules accommodated in the subrack 20c. That is, as shown in FIG. 7C, three radial fans 1 are arranged in a front row and four radial fans 1 are arranged in a rear row of a cooling fan unit 50, with the radial fans 1 being staggered with respect to the radial fans 1 of an adjacent row. As stated above, the subrack 20b is of the same construction as the subrack 20a.

Like the cooling fan unit 30 of FIGS. 6B and 6C, the cooling fan unit 50 has lattice-like exhaust ports 52 in side members 51a and a rear member 51b. The cooling air from the radial fans 1 arranged on the rear side is exhausted mainly by way of the exhaust ports 52 of the rear member 51b, whereas the cooling air from the radial fans 1 arranged on the front side is exhausted mainly through the exhaust ports 52 of the side members 51a. In particular, the cooling air from the central radial fan 1 on the front side passes in front of the adjacent radial fans 1 of the front row, and is exhausted through the exhaust ports 52 of the side members 51a. However, actually, the cooling airflows from the radial fans 1 are exhausted through the exhaust ports 52 of the side members 51a or the rear member 51b while colliding with each other inside the cooling fan unit 50.

The cooling air exhausted through the exhaust ports 52 of the side members 51a passes through spaces between the side members 51a and the side plates 21a of the subrack casing 21, and flows by way of the rear side of the subrack 20a to be exhausted from the rear side of the apparatus frame 10.

In the construction of the first exemplary embodiment described above, the cooling air from the radial fans 1 on the rear side is exhausted mainly by way of the exhaust ports 32 and 52 of the rear members 31b and 51b of the cooling fan units 30 and 50, respectively, whereas the cooling air from the radial fans 1 on the front side is exhausted mainly by way of the exhaust ports 32 and 52 of the side members 31a and 51a, respectively. For example, in the conventional fan unit shown in FIG. 2, if radial fans are also arranged on the front side, the cooling air from the radial fans on the front side is not exhausted, so there is a possibility of the cooling capacity being reduced. According to this exemplary embodiment, in contrast, the cooling air from the radial fans 1 on the front side is also easily exhausted, so it is possible to prevent a reduction in cooling capacity. In this way, in the cooling fan unit 30 and 50 of this exemplary embodiment, due to the provision of additional radial fans 1, if the exhaust airflows interfere with each other to some degree, they are easily exhausted through the exhaust ports 32 and 52, so it is possible to secure a cooling capacity larger than that of the conventional fan unit shown in FIG. 2.

Further, as compared with the conventional fan unit in which the radial fans are arranged in a single row, static pressure capacity (capacity to send out air) of each of the cooling fan units 30 and 50 increases. The radial fans 1 on the front side have an effect of increasing an amount of air drawn out from the radial fans 1 on the rear side. Thus, even if the exhaust air of the radial fans 1 on the front side is suppressed by interference with the exhaust air of the radial fans 1 on the rear side, an effect of compensating for this suppression is to be expected. Thus, in the first exemplary embodiment, it is substantially possible to secure an amount of air corresponding to the number of radial fans 1 arranged in each of the cooling fan units 30 and 50.

As described above, according to the first exemplary embodiment, the radial fans 1 are arranged within the cooling fan units 30 and 50 in a plurality of rows parallel to the rear members 31b and 51b, so it is advantageously possible to secure the requisite air amount for cooling the electronic components while maintaining a thin structure of each of the cooling fan units 30 and 50. Further, due to the formation of the exhaust ports 32 and 52 in the rear members 31b and 51b and the side members 31a and 51a of the cooling fan units 30 and 50, respectively, the mutual interference of the exhaust airflows from the plurality of radial fans 1 is mitigated.

Further, the plurality of radial fans 1 are arranged in at least two rows, and the radial fans 1 of rows adjacent to each other are staggered with respect to each other, so the air from the radial fans 1 on the rear side is exhausted mainly through the exhaust ports 32 and 52 of the rear members 31b and 51b, and the air from the radial fans 1 on the front side is exhausted mainly through the exhaust ports 32 and 52 of the side members 31a and 51a. As a result, the mutual interference of the exhaust airflows from the radial fans on the front side and the rear side is further mitigated.

Further, since the intake ports 24 are formed in lower portions of the side plates 21a and the rear plate 21b of the subrack casing 21 and at positions of the front surface adjacent to the bottom member 21d, it is possible to realize an effective intake even if the intake ports 24 are arranged according to limitations in terms of arrangement. It is particularly desirable to form the intake ports 24 in all of the side plates 21a and the rear plate 21b of the subrack casing 21 and the positions of the front surface adjacent to the bottom member 21d since that makes it possible to obtain a more uniform air flow in a large amount.

Figure 8A:
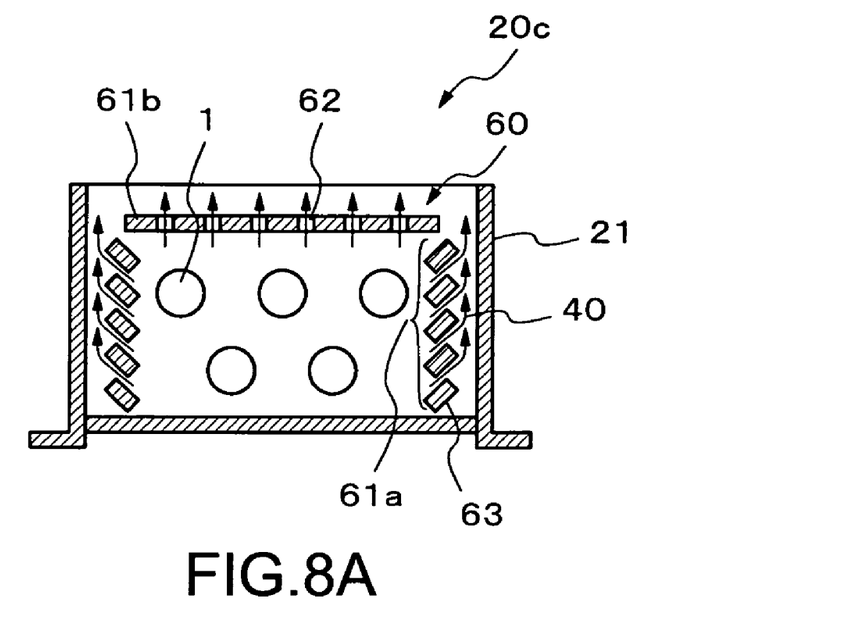
FIG. 8A is a diagram showing a first modification of the subrack of the exemplary embodiment shown in FIG. 5C.
Figure 8B:
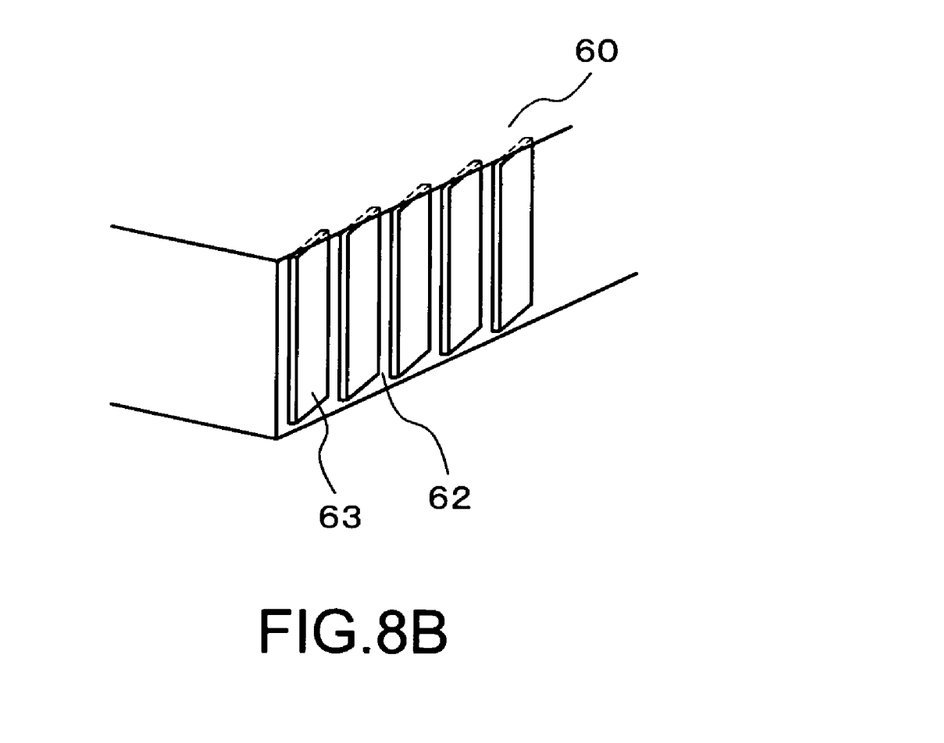
FIG. 8B is an enlarged perspective view of a side surface member of a cooling fan unit.

FIG. 8A is a diagram showing a first modification of the subrack 20c of the exemplary embodiment of the present invention shown in FIG. 5C. Both side members 61a of a cooling fan unit 60 according to the first modification are louvered. FIG. 8B is an enlarged perspective view of a side surface of the cooling fan unit 60. Gaps between louvers 63 constitute exhaust ports 62 for the cooling air 40. The direction of the cooling air 40 can be controlled by the louvers 63. The louvers 63 are installed at a desired angle such that the cooling air 40 smoothly passes through the gaps between the side members 61a of the cooling fan unit 60 and the side plates 21a of the subrack casing 21. The louvers 63 may be arranged so as to extend toward interior of the cooling fan unit 60 as shown in FIG. 8B, or toward exterior thereof.

As described above, the louvers 63 are formed at the exhaust ports 62, whereby it is possible to control the direction of the cooling air, making it possible to perform exhaust efficiently.

Figure 9:
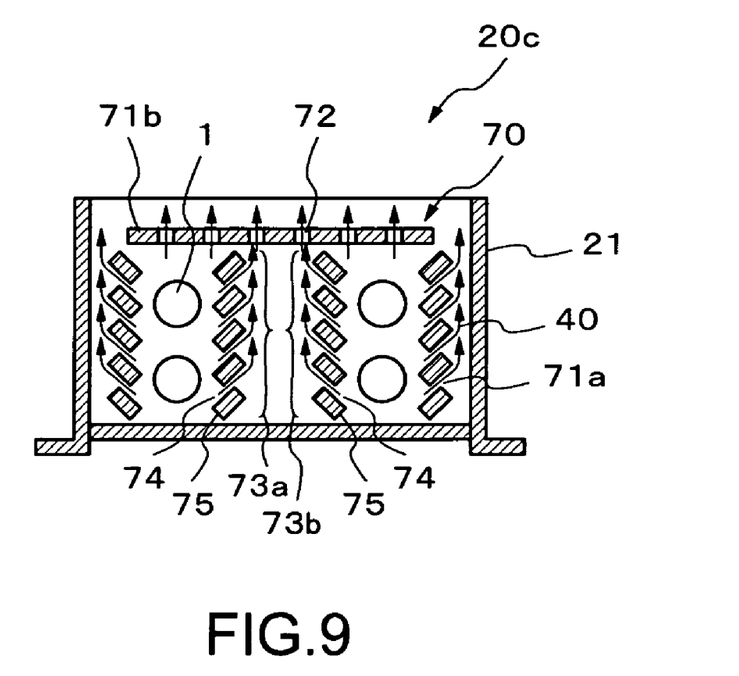
FIG. 9 is a diagram showing a second modification of the subrack of the exemplary embodiment shown in FIG. 5C.

FIG. 9 is a diagram showing a second modification of the subrack 20c of the exemplary embodiment of the present invention shown in FIG. 5C. In the first modification shown in FIG. 8A, mutual interference of the cooling air 40 may occur between the radial fans 1 arranged in the same row. In view of this, unlike the modification shown in FIG. 8A, the second modification shown in FIG. 9 adopts a construction in which the number of radial fans in each of the rows parallel to a rear member 71b is two, with exhaust members 73a and 73b being arranged between the radial fans arranged in each row. The exhaust members 73a and 73b are equipped with exhaust ports 74 and louvers 75 of the same construction as those of the modification shown in FIG. 8A. Due to the louvers 75, the cooling air between the radial fans arranged each row is forcibly directed toward exhaust ports 72 of a rear member 71b of a radial fan unit 70. As a result, it is possible to avoid mutual interference of the cooling air between the radial fans 1 arranged in each row.

Figure 10:
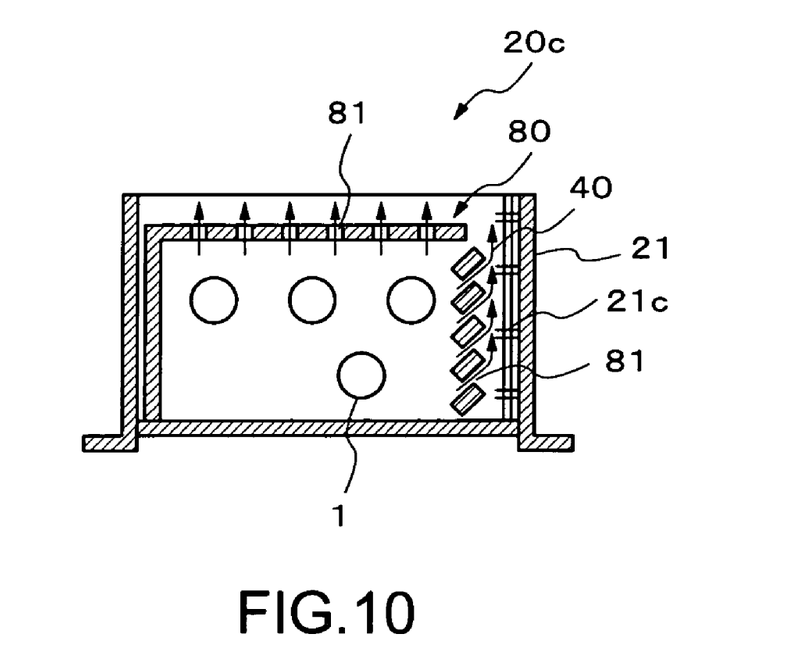
FIG. 10 is a diagram showing a third modification of the subrack of the exemplary embodiment shown in FIG. 5C.

FIG. 10 is a diagram showing a third modification of the subrack 20c of the exemplary embodiment of the present invention shown in FIG. 5C. In this modification, a cooling fan unit 80 is shifted to one side plate 21a side of the subrack casing 21. With this arrangement, the gap between the fan unit 80 and the other side plate 21a of the subrack casing 21 is wider than that in the modifications shown in FIGS. 8A and 9, and it is possible to secure the passage for the cooling air 40 by utilizing this gap. The cooling air 40 from the radial fans 1 is discharged through exhaust ports 81. In this way, there are no limitations regarding the mounting position of the cooling fan unit 80 on the support member 21c of the subrack casing 21.

Figure 11:
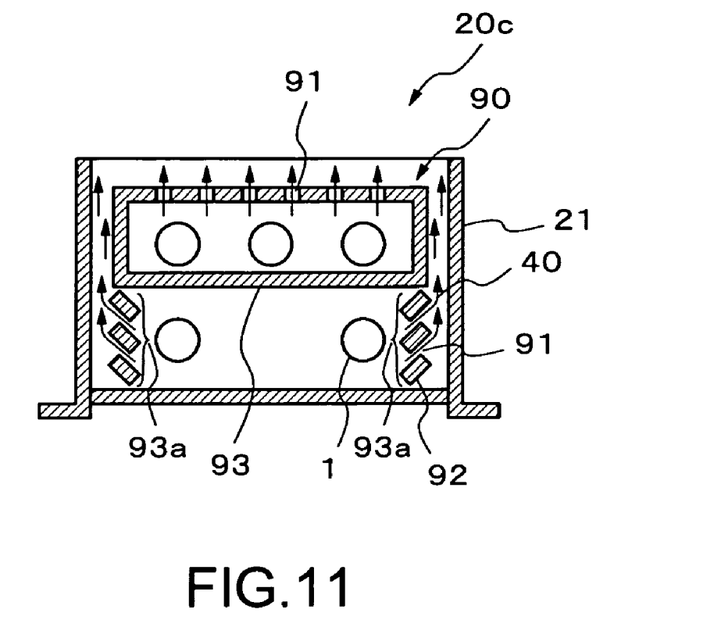
FIG. 11 is a diagram showing a fourth modification of the subrack of the exemplary embodiment shown in FIG. 5C.

FIG. 11 is a diagram showing a fourth modification of the subrack 20c of the exemplary embodiment of the present invention shown in FIG. 5C. In this modification, in contrast to the modification shown in FIG. 8A, a partition member 93 is provided between the two rows of radial fans 1. Further, the exhaust ports and the louvers of the side members for the rear radial fans 1 are eliminated, and exhaust ports 91 and louvers 92 are provided in side members 93a for the front radial fans 1. The height of the partition member 93 may, for example, be not less than the height of the radial fans 1 and not more than the height of the cooling fan unit 90. With this construction, the air from the rear radial fans 1 is exhausted solely from the rear side, so it is possible to further avoid interference with the exhaust air from the sides of the front radial fans 1.

Figure 12:
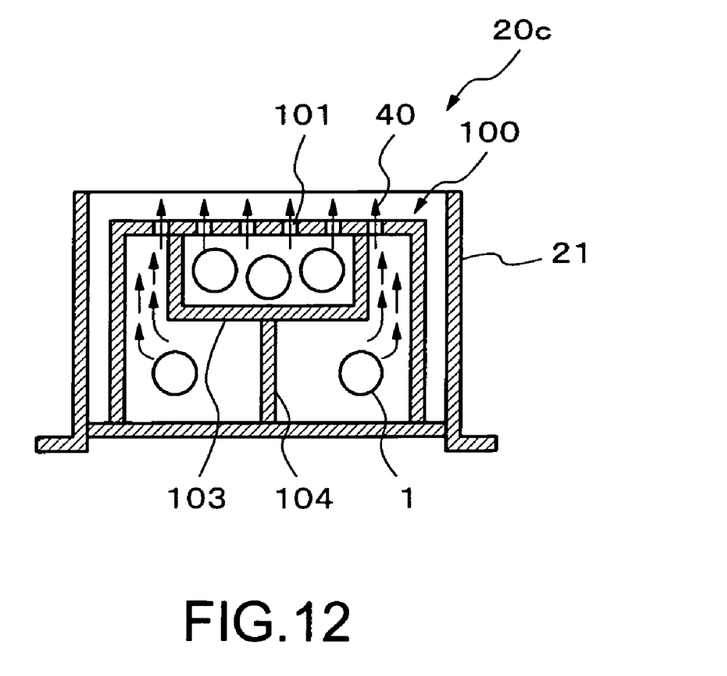
FIG. 12 shows a fifth modification obtained by further modifying the fourth modification shown in FIG. 11.

FIG. 12 shows a fifth modification obtained by further modifying the fourth modification shown in FIG. 11. In a cooling fan unit 100 of the modification shown in FIG. 12, the exhaust ports 91 of the side members 93a of the cooling fan unit 90 of FIG. 11 are eliminated. Further, the central radial fan 1 in the rear row is shifted from the row to reduce the row dimension of the rear row of the radial fans 1, with the radial fans 1 of the rear row being surrounded by a partition member 103. Further, the radial fans 1 of the front row are separated from each other by a partition member 104. A space generated through the reduction in the dimension of the rear row of the radial fans 1 provides the passage for the cooling air 40 from the front radial fans 1.

Figure 13:
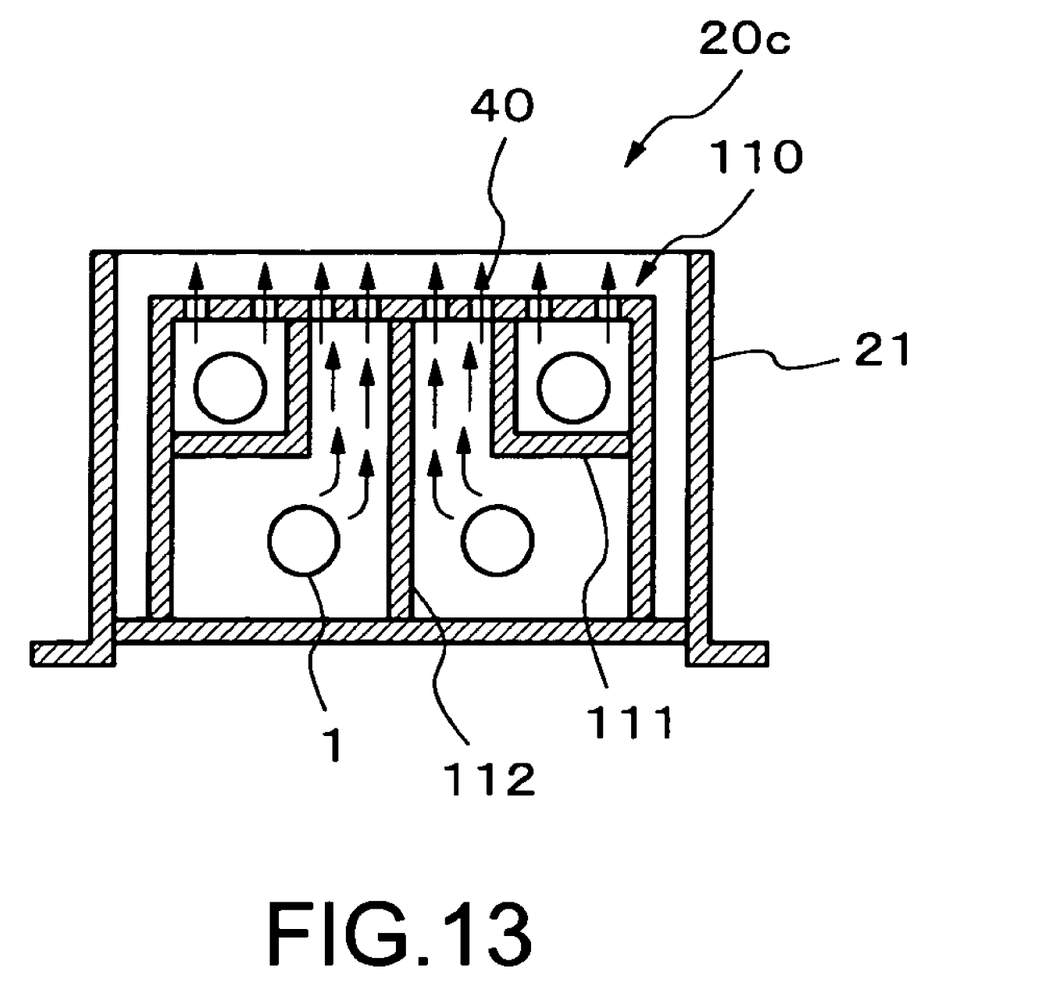
FIG. 13 shows a sixth modification obtained by further modifying the fifth modification shown in FIG. 12.

FIG. 13 shows a sixth modification obtained by further modifying the fifth modification shown in FIG. 12. In contrast to the modification shown in FIG. 12, in the modification of FIG. 13, the central radial fan of the rear row is eliminated. Further, the radial fans at both ends of the rear row are shifted to the corners and are surrounded by partition members 111. Further, a partition member 112 is provided for separating the cooling fan unit at the center. With this construction, the cooling air from the front radial fans 1 is exhausted from the open central space instead of from the passages on both sides of the cooling fan unit 30 in the modification shown in FIG. 12.

In the examples shown in FIGS. 11 through 13, there is provided a partition member between at least apart of the adjacent radial fans 1 in the cooling fan unit casing, and the radial fans exist with the partition member provided therebetween, with the cooling air from the radial fans being exhausted through the exhaust ports, whereby it is possible to avoid interference between the exhaust airflows from the radial fans 1.

It is also possible to form a cooling fan unit and a subrack through a combination of the modifications of FIG. 8A and FIGS. 9 through 13.

Figure 14A:
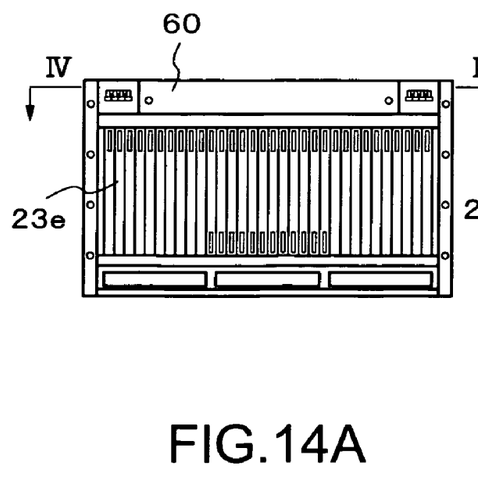
FIG. 14A is a front view schematically showing a construction of a subrack provided in an electronic apparatus according to a second exemplary embodiment of the present invention.
Figure 14B:
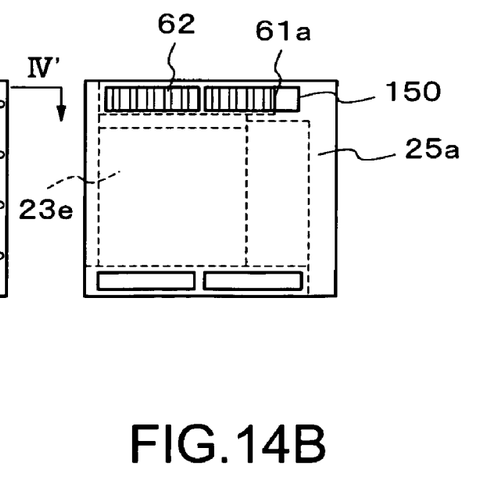
FIG. 14B is a side view schematically showing the construction of the subrack provided in the electronic apparatus according to the second exemplary embodiment of the present invention.
Figure 14C:
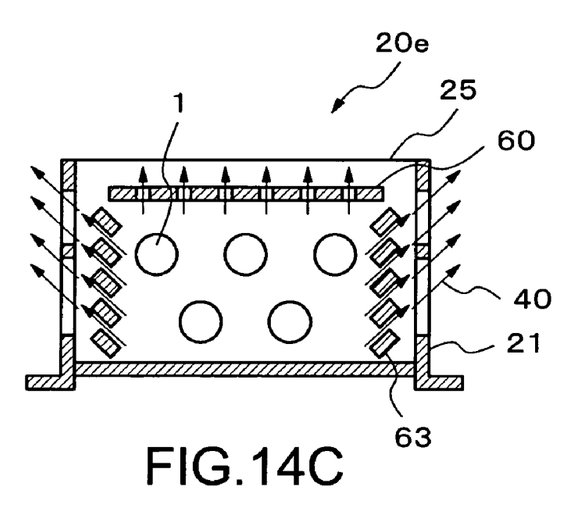
FIG. 14C is a sectional view taken along the line IV-IV' of FIG. 14A.

FIGS. 14A and 14B are a front view and a side view schematically showing a construction of a subrack 20e included in an electronic apparatus according to a second exemplary embodiment of the present invention. FIG. 14C is a sectional view taken along the line IV-IV' of FIG. 14A. The subrack 20e accommodates an electronic component module group 23e. Further, a cooling fan unit 60 as shown in FIG. 8A is provided on top of the electronic component module group 23e.

As shown in FIG. 14B, in this exemplary embodiment, each side plate 25a of the subrack casing 25 of the subrack 20e has side surface openings 150 formed at positions corresponding to the exhaust ports 62 of the side members 61a of the cooling fan unit 60 shown in FIG. 8A. As a result, as shown in FIG. 14C, the cooling air 40 from the exhaust ports 62 of the side members 61a of the cooling fan unit 60 is directly discharged to the exterior. Louvers 63 are arranged at the exhaust ports 62 of the side members 61a of the cooling fan unit 60. Due to the louvers 63, the cooling air 40 is smoothly discharged from the cooling fan unit 60 to the exterior of the subrack casing 25.

As described above, according to the second exemplary embodiment of the present invention, the side surface openings 150 are formed in the side plate 25a of the subrack casing 25 in correspondence with the exhaust ports 62 of the side members 61a of the cooling fan unit 60, whereby it is possible to exhaust the cooling air efficiently through the exhaust ports 62 of the side members 61a of the cooling fan unit 60.

While this invention has been described in connection with certain exemplary embodiments, it is to be understood that the subject matter encompassed by way of this invention is not to be limited to those specific exemplary embodiments. On the contrary, it is intended for the subject matter of the invention to include all alternative, update, and equivalents as can be included within the spirit and scope of the following claims.

Further, the inventor's invention is to retain all equivalents of the claimed invention even if the claims are amended during prosecution.

What is claimed is:

1. A subrack comprising:
   a shelf which accommodates electronic components; and
   a fan unit arranged above the electronic components and including a plurality of radial fans, which includes a plurality of groups of radial fans, and a unit casing which accommodates the radial fans and includes a rear member and a side member, each of which has exhaust ports allowing transmission of at least a part of output air from the radial fans,
   wherein the radial fans of each of the plurality of groups are arranged in a row parallel to the rear member,
   wherein the plurality of groups of radial fans are arranged in a plurality of rows staggered with respect to the radial fans of an adjacent row,
   wherein at least one air flow passage to the exhaust ports is formed for each of said plurality of radial fans,
   wherein for at least one of said plurality of radial fans air is exhausted via a plurality of air flow passages to exhaust ports disposed on side and rear members,
   wherein the shelf is equipped with a side member, a rear member, a front member, and a bottom member,
   wherein at least one of the side member, the rear member, and the front member has an intake port formed at a position adjacent to the bottom member, and
   wherein the side member of the shelf has a side surface opening formed in correspondence with at least a part of the exhaust sort formed in the rear member or the side member of the unit casing, and a position of the side surface opening is determined so that the output air from the radial fan is directly discharged to an exterior.

2. A subrack according to claim 1, wherein the exhaust ports are rectangular holes.

3. A subrack according to claim 1, wherein the rear member and the side member of the unit casing are louvered at least partially.

4. A subrack according to claim 1, wherein at least a part of a portion between adjacent radial fans in the unit casing is louvered.

5. A subrack according to claim 1, further comprising a partition member provided between at least a part of the adjacent radial fans inside the unit casing.

6. An electronic apparatus comprising:
   a subrack having a shelf which accommodates electronic components, and a fan unit arranged above the electronic components, said fan unit including a plurality of radial fans, which includes a plurality of groups of radial fans, and a unit casing which accommodates the radial fans and includes a rear member and a side member, each of which has exhaust ports allowing transmission of at least a part of output air from the radial fans; and
   an apparatus frame which accommodates the subrack,
   wherein the radial fans of each of the plurality of groups are arranged in a row parallel to the rear member,
   wherein the plurality of groups of radial fans are arranged in a plurality of rows staggered with respect to the radial fans of an adjacent row,
   wherein at least one air flow passage to the exhaust ports is formed for each of said plurality of radial fans, wherein for at least one of said plurality of radial fans air is exhausted via a plurality of air flow passages to exhaust ports disposed on side and rear members, wherein the shelf is equipped with a side member, a rear member, a front member, and a bottom member, wherein at least one of the side member, the rear member, and the front member has an intake port formed at a position adjacent to the bottom member, and wherein the side member of the shelf has a side surface opening formed in correspondence with at least a part of the exhaust port formed in the rear member or the side member of the unit casing.

7. An electronic apparatus according to claim 6, wherein the exhaust ports are rectangular holes.

8. An electronic apparatus according to claim 6, wherein the rear member and the side member of the unit casing are louvered at least partially.

9. An electronic apparatus according to claim 6, wherein at least a part of a portion between adjacent radial fans in the unit casing is louvered.

10. An electronic apparatus according to claim 6, further comprising a partition member provided between at least a part of the adjacent radial fans inside the unit casing.

11. A subrack according to claim 1, wherein
a part of first output air flow from the radial fans of a row nearest to the rear member is exhausted by way of the exhaust port of the rear member, and
second output air flows from the radial fans of a row farthest from the rear member are mainly exhausted by way of the exhaust port of the side members.

12. A subrack according to claim 11, wherein the part of the first output air flow runs in a first direction orthogonal to the rear member and the second output air flow runs in a second direction parallel to the rear member.

13. An electronic apparatus according to claim 6, wherein
a part of first output air flow from the radial fans of a row nearest to the rear member is exhausted by way of the exhaust port of the rear member, and
second output air flows from the radial fans of a row farthest from the rear member are mainly exhausted by way of the exhaust ports of the side members.

14. An electronic apparatus according to claim 13, wherein the part of the first output air flow runs in a first direction orthogonal to the rear member, and the second output air flow runs in a second direction parallel to the rear member.

15. A subrack according to claim 1, wherein air exhausted from the exhaust ports of the side members is discharged from a rear side.

16. An electronic apparatus according to claim 6, wherein air exhausted from the exhaust ports of the side members is discharged from a rear side.

* * * * *